(12) United States Patent
Kamath et al.

(10) Patent No.: US 10,332,686 B2
(45) Date of Patent: Jun. 25, 2019

(54) HIGH PRECISION CAPACITORS

(71) Applicant: Thin Film Electronics ASA, Oslo (NO)

(72) Inventors: Arvind Kamath, Los Altos, CA (US); Criswell Choi, Menlo Park, CA (US); Patrick Smith, San Jose, CA (US); Erik Scher, San Francisco, CA (US); Jiang Li, San Jose, CA (US)

(73) Assignee: Thin Film Electronics ASA, Oslo (NO)

(*) Notice: Subject to any disclaimer, the term of this patent is extended or adjusted under 35 U.S.C. 154(b) by 0 days.

(21) Appl. No.: 15/385,727

(22) Filed: Dec. 20, 2016

(65) Prior Publication Data

US 2017/0098508 A1 Apr. 6, 2017

Related U.S. Application Data

(62) Division of application No. 14/613,178, filed on Feb. 3, 2015, now Pat. No. 9,552,924, which is a division
(Continued)

(51) Int. Cl.
*H01G 4/06* (2006.01)
*H01G 4/005* (2006.01)
(Continued)

(52) U.S. Cl.
CPC ............... *H01G 4/40* (2013.01); *H01G 4/002* (2013.01); *H01G 4/005* (2013.01); *H01G 4/008* (2013.01);
(Continued)

(58) Field of Classification Search
CPC ............................... H01G 4/30; H01G 4/1227
(Continued)

(56) References Cited

U.S. PATENT DOCUMENTS

| 5,302,844 A | 4/1994 | Mizuno et al. |
| 5,605,858 A | 2/1997 | Nishioka et al. |

(Continued)

FOREIGN PATENT DOCUMENTS

| JP | 2001250095 A | 9/2001 |
| JP | 2006005293 A | 1/2006 |
| WO | 2006014753 A1 | 2/2006 |

OTHER PUBLICATIONS

Higuchi, Takuya; "Antenna Sheet and Non-Contact Data Carrier"; Abstract of JP 2001250095 (A); Sep. 14, 2001; http://worldwide.espacenet.com.
(Continued)

*Primary Examiner* — Eric W Thomas
(74) *Attorney, Agent, or Firm* — Andrew D. Fortney; Central California IP Group, P.C.

(57) ABSTRACT

High precision capacitors and methods for forming the same utilizing a precise and highly conformal deposition process for depositing an insulating layer on substrates of various roughness and composition. The method generally comprises the steps of depositing a first insulating layer on a metal substrate by atomic layer deposition (ALD); (b) forming a first capacitor electrode on the first insulating layer; and (c) forming a second insulating layer on the first insulating layer and on or adjacent to the first capacitor electrode. Embodiments provide an improved deposition process that produces a highly conformal insulating layer on a wide range of substrates, and thereby, an improved capacitor.

20 Claims, 6 Drawing Sheets

Related U.S. Application Data of application No. 13/868,916, filed on Apr. 23, 2013, now Pat. No. 8,973,231, which is a division of application No. 12/249,841, filed on Oct. 10, 2008, now Pat. No. 8,446,706.

(60) Provisional application No. 60/979,054, filed on Oct. 10, 2007.

(51) Int. Cl.

| | | |
|---|---|---|
| *H01G 4/33* | (2006.01) | |
| *H01G 4/40* | (2006.01) | |
| *H01G 4/002* | (2006.01) | |
| *H01L 27/01* | (2006.01) | |
| *H01L 49/02* | (2006.01) | |
| *H01G 4/01* | (2006.01) | |
| *H01G 13/00* | (2013.01) | |
| *H01G 4/10* | (2006.01) | |
| *H01G 4/30* | (2006.01) | |
| *H01Q 1/22* | (2006.01) | |
| *H01G 4/008* | (2006.01) | |
| *H01G 4/12* | (2006.01) | |
| *H01G 4/224* | (2006.01) | |
| *H01L 23/66* | (2006.01) | |
| *H01Q 1/38* | (2006.01) | |

(52) U.S. Cl.
CPC ................. *H01G 4/01* (2013.01); *H01G 4/10* (2013.01); *H01G 4/1209* (2013.01); *H01G 4/224* (2013.01); *H01G 4/30* (2013.01); *H01G 4/306* (2013.01); *H01G 4/33* (2013.01); *H01G 13/00* (2013.01); *H01L 23/66* (2013.01); *H01L 27/016* (2013.01); *H01L 28/60* (2013.01); *H01Q 1/22* (2013.01); *H01Q 1/2283* (2013.01); *H01Q 1/38* (2013.01); *H01L 2223/6677* (2013.01); *Y10T 29/43* (2015.01); *Y10T 29/435* (2015.01); *Y10T 29/49002* (2015.01); *Y10T 29/49016* (2015.01)

(58) Field of Classification Search
USPC ...................................... 361/301.4
See application file for complete search history.

(56) References Cited

U.S. PATENT DOCUMENTS

| | | |
|---|---|---|
| 5,841,350 A | 11/1998 | Appalucci et al. |
| 5,998,825 A | 12/1999 | Ochiai |
| 6,025,780 A | 2/2000 | Bowers et al. |
| 6,118,411 A | 9/2000 | Hasegawa et al. |
| 6,226,170 B1 | 5/2001 | Nellissen et al. |
| 6,541,812 B2 | 4/2003 | Akram |
| 6,853,051 B2 | 2/2005 | Shioga et al. |
| 8,426,905 B2 | 4/2013 | Kamath et al. |
| 8,446,706 B1 * | 5/2013 | Kamath .................. H01G 4/005 361/303 |
| 2005/0067701 A1 | 3/2005 | Coolbaugh et al. |
| 2006/0262481 A1 | 11/2006 | Mashiko |

OTHER PUBLICATIONS

Murata, Shinji; "Thin Film Capacitor Element"; Abstract of JP 2006005293 (A); http://worldwide.espacenet.com.

* cited by examiner

HIGH PRECISION CAPACITORS

RELATED APPLICATIONS

This application is a divisional of U.S. patent application Ser. No. 14/613,178, filed Feb. 3, 2015, pending, which is a divisional of U.S. patent application Ser. No. 13/868,916, filed Apr. 23, 2013, now U.S. Pat. No. 8,973,231, which is a divisional of U.S. patent application Ser. No. 12/249,841, filed Oct. 10, 2008, now U.S. Pat. No. 8,446,706, which in turn claims the benefit of U.S. Provisional Application No. 60/979,054, filed Oct. 10, 2007, each of which is incorporated herein by reference in its entirety.

FIELD OF THE INVENTION

Embodiments of the present invention relate to depositing (e.g., by atomic layer deposition) or otherwise forming a uniform, highly conformal insulating layer to form a high precision capacitor. Embodiments of the present invention provide improved control of the insulating layer deposition process on various substrates of various surface roughnesses, allowing for more precise insulating layers and processes for making capacitors. As a result, high precision capacitors can be formed on a wide range of substrates.

DISCUSSION OF THE BACKGROUND

Previously, there have been challenges in precisely depositing an insulating layer on substrates of various surface roughnesses. Conventional deposition processes have resulted in poor levels of conformality (uniform thickness or surface coverage uniformity of the insulating layer over the substrate) and thickness control, resulting in thin spots or undeposited areas. Generally, the resulting thin spots or undeposited areas lead to premature breakdown and/or a high defect density in the production of an electronic device. Thus, an ideal deposition process for depositing insulating layers on substrates having various surface roughnesses has been difficult to achieve.

Typically, insulating layers in high performance electronic devices are deposited by chemical vapor deposition (CVD). However, CVD methods may not achieve a desired level of conformality, resulting in the production of substandard capacitors having thin spots or undeposited areas. It would be advantageous to replace such processing steps with more effective processing techniques.

SUMMARY OF THE INVENTION

The present invention is directed to methods of making thin film devices (e.g., transistors, capacitors, diodes, etc.) and circuits including the same on various substrates including, but not limited to, glass (e.g., silica, quartz) sheets, wafers or slips, plastic and/or metal foils or sheets, silicon wafers, etc., all of which may carry one or more additional (e.g., buffer, planarization mechanical support, etc.) layers. More specifically, embodiments of the present invention relate to an improved deposition process (e.g., atomic layer deposition) for forming an insulating layer on the substrate. Atomic layer deposition (ALD) of the insulating layer provides a higher level of conformality of the insulating layer over the substrate. Thus, the processes described herein allow for a more precise and conformal capacitor in dielectric high performance printed electronic devices, such as wireless circuits, RFID and other identification tags, EAS devices, etc.

One object of the invention is to provide a method of forming a capacitor, comprising the steps of depositing a first insulating layer on a metal substrate by atomic layer deposition (ALD); forming a first capacitor electrode on the first insulating layer; and forming a second insulating layer on the first insulating layer and on or adjacent to the first capacitor electrode. In one embodiment, the metal substrate further comprises a barrier layer thereon, on which the first insulating layer is deposited.

Alternatively, another embodiment comprises the steps of depositing a first metal layer on an insulative substrate to form a first capacitor electrode; depositing a first insulating layer on the metal layer by atomic layer deposition (ALD); forming a second capacitor electrode on the first insulating layer; and forming a second insulating layer on the first insulating layer and on or adjacent to the second capacitor electrode.

A further object of the invention is to provide a capacitor, comprising a metal substrate selected from the group consisting of foils and sheets of stainless steel, molybdenum, copper, and aluminum; a first insulating layer on the metal substrate, the first insulating layer having a substantially uniform thickness of from 3 Å to 200 Å; a first capacitor electrode on the first insulating layer; and a second insulating layer on the first capacitor electrode and the first insulating layer.

Alternatively, another object of the invention is to provide a capacitor, comprising an insulative substrate selected from the group consisting of a polyimide, a glass/polymer laminate, or a high temperature polymer; a first metal capacitor electrode thereon; a first insulating layer on said first metal capacitor electrode, said first insulating layer having a substantially uniform thickness of from 3 Å to 200 Å; an opening in said first insulating layer exposing said first metal capacitor electrode; a second capacitor electrode on the first insulating layer; and a second insulating layer on the first capacitor electrode and the first insulating layer.

Embodiments of the present invention enable precise deposition of an insulating layer on substrates of various surface roughnesses and compositions. In addition, the present invention advantageously utilizes atomic layer deposition (ALD) for depositing an insulating layer on a substrate without the need for additional planarization through high cost polishing of the substrate surface. A further aspect of the present invention replaces the relatively difficult-to-control conventional processes and structures, by providing a deposition process that produces a high level of conformality in the insulating layer on a wide range of substrates.

Embodiments of the present invention may eliminate thin spots or undeposited areas in capacitor dielectric, which may lead to premature breakdown and/or high defect densities. Embodiments of the present invention also reduce or eliminate charge leakage and unpredictability in capacitor properties, thereby enabling lower processing margins. Furthermore, embodiments of the present invention eliminate problems with EAS devices that are presumed to be active, but are actually inactive or ineffective, or that can be easily deactivated by weak electrical fields. As a result, the present invention provides a more viable production process for making high precision capacitors.

The present invention may be applicable to the manufacturing of thin film capacitors and circuits containing the same, alone or in combination with thin film transistors, diodes, resistors, etc., on various substrates including, but not limited to, glass (e.g., quartz) sheets or slips, plastic and/or metal foils, sheets or slabs, silicon wafers, etc., all of which may further include one or more buffer and/or planarization layers (such as a polyimide or other polymer, silicon and/or aluminum oxide, etc.) thereon. Applications of the circuitry include but are not limited to displays, RF devices, HF devices, VHF devices, UHF devices, wireless devices, smart tags, surveillance and/or security tags and cards (e.g., EAS tags), sensors, photovoltaic cells, etc. These and other advantages of the present invention will become readily apparent from the detailed description of preferred embodiments below.

DETAILED DESCRIPTION OF THE PREFERRED EMBODIMENTS

Figure 1A:
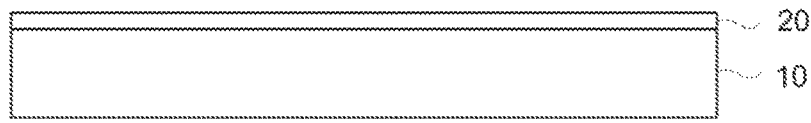
FIGS. 1A-1C show cross-sectional views of various stages of an exemplary embodiment of the present method.

Reference will now be made in detail to preferred embodiments of the invention, examples of which are illustrated in the accompanying drawings. While the invention will be described in conjunction with preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the terms "coupled to," "connected to," and "in communication with" mean direct or indirect coupling, connection or communication unless the context indicates otherwise. These terms are generally used interchangeably herein, but are generally given their art-recognized meanings. In the present disclosure, the term "deposit" (and grammatical variations thereof) is intended to encompass all forms of deposition, including blanket deposition, coating, plating, and printing, unless the context clearly indicates otherwise. Furthermore, with regard to certain materials, the phrase "consisting essentially of" does not exclude intentionally added dopants, which may give the material to which the dopant is added (or the element or structure formed from such material) certain desired (and potentially quite different) physical and/or electrical properties. Also, the term "integrated circuitry" or "IC" refers to a unitary structure comprising a plurality of electrically active devices formed from a plurality of conductor, semiconductor and insulator thin films, but generally does not include discrete, mechanically attached components (such as die, wire bonds and leads, an interposer or electrically inactive substrate, or an externally/physically attached antenna and/or inductor component), or materials having primarily an adhesive function. In addition, the terms "item," "object" and "article" are used interchangeably, and wherever one such term is used, it also encompasses the other terms.

The present invention concerns a method for forming high precision capacitors on various substrates utilizing a precise and highly conformal deposition process for depositing an insulating layer on substrates of various surface textures. Typically, a robust, high precision, high capacitance capacitor device includes an insulating layer having a repeatable, controlled thickness over large areas and batches (e.g., from batch-to-batch and/or lot-to-lot), providing reliable capacitor properties (e.g., thickness, dielectric constant, breakdown characteristics, permeability and/or density).

Furthermore, the production of robust, high precision, high capacitance capacitors may include relatively low thicknesses for the capacitor dielectric, depending on the breakdown voltage requirements. A relatively low breakdown voltage correlates to rather small dielectric thicknesses (e.g., <50 Å in some cases). The minimum thickness of the dielectric/insulating thickness is determined primarily by the equation:

$$C = eA/d$$

where C=capacitance or the charge storage ability of the capacitor device, e=dielectric constant of the insulator, A=capacitor area, and d=dielectric thickness. Practical restrictions on the capacitor area A and/or the capacitance C often restrict the range of acceptable dielectric thicknesses d. For example, it is often desirable to minimize the area A or target a specific capacitance C.

In addition, to accomplish viable production of high capacitance capacitors, a low defect density (e.g., to improve cost and/or reliability) and low leakage of stored charge are desirable. The above-mentioned characteristics are influenced by the properties of the dielectric material(s) and/or the process parameters (e.g., conformality, process sensitivity, substrate surface cleanliness, such as impurities or particles, substrate roughness, thickness regime, substrate-insulator material-process interactions, etc.).

The present invention enables relatively rough, low cost metal substrates to be used as robust, high precision, high capacitance devices. Typically, it is challenging to use such substrates in conventional processes to make high precision, high capacitance structures, especially in the thickness regimes of many commercial applications within the scope of this invention. In these thickness regimes, conventional deposition processes and structures generally have relatively poor step coverage and thickness control, and it may not be possible to overcome the high defect rates induced by metal substrate surface roughness and/or low margins/tolerances using conventional processing. Furthermore, the precision of conventional deposition processes and structures are limited by the variability of nucleation incubation times, local temperatures, and gas chemical concentrations. This is especially exacerbated when making insulating layers having low thickness (e.g., from ≤30 Å [e.g., 20-30 Å], up to about 50 Å) and low variability (e.g., a total of +/−5%, or 3 σ variation), which is typically unachievable by CVD.

Exemplary Methods of Making Capacitors using Metal Substrates

Embodiments of the present invention concern a method of forming a high precision, high capacitance capacitor, on nearly any kind of substrate (e.g., conductive, semiconductive, or insulative). In the exemplary embodiment shown in FIG. 1A, a metal substrate 10 may serve as a physical support and as a lower electrode. For example, the metal substrate 10 may comprise a metal foil or metal sheet. The metal foil or sheet may be round, square, rectangular, or other shape suitable for subsequent processing. Round substrates may have a radius of at least 2 cm, 5 cm, 10 cm or more, up to (for example) 25 cm, 50 cm or 75 cm, or any range of values from 2 to 75 cm. Square or rectangular substrates may have an area of x cm by y cm, where x and y are individually from 2 to 150 cm, or any range of values therein (e.g., 5 to 100 cm, 10 to 50 cm, etc.), such that the substrate has a total area of at least 10 cm$^2$, 50 cm$^2$, 100 cm$^2$, or more.

The metal foil or metal sheet may comprise a number of divisible individual substrate units for individual devices (similar to die on a semiconductor wafer or stamps in a sheet of stamps). A square or rectangular substrates may be laid out in an array of a-by-b units, where a and b are individually at least 2 (e.g., 3, 4, 5, or any other integer of at least 2). In theory, a and b may be limitless, but as a practical matter, at least one of a and b is not greater than about 10,000 (e.g., 5000, 1000, 500, 100, or any other integer of at most about 10,000).

Alternatively, the metal foil or metal sheet may comprise a roll having a width of z cm and/or c units, and essentially indeterminate and/or infinite length. In general, z and c may be as wide as can be processed by roll-to-roll metal processing equipment. In various implementations, z is similar to x and y above (e.g., from 2 to 150 cm), and c may be similar to a and b (e.g., an integer of at least 2). The metal foils, sheets and/or rolls include, but are not limited to, stainless steel, molybdenum, copper, aluminum, or any other metal available in sheet, foil or roll form. The metal substrate 10 serves as a low cost, mechanically robust, and flexible substrate on which electronic circuitry or devices can be built, and from which components for such electronic circuitry can be made.

Typically, a metal foil or metal sheet has a thickness ranging from 1 μm to greater than 300 μm (preferably 20 μm to 100 μm, or any range of values therein). In the present invention, the conductive metal substrate may also serve as a source for resistors, capacitor plates or capacitors, inductors and/or antennas (see, e.g., U.S. Pat. Nos. 7,152,804, 7,286,053 and 7,387,260, and U.S. patent application Ser. Nos. 11/243,460 and 11/452,108, respectively filed Oct. 3, 2005 and Jun. 12, 2006, the relevant portions of each of which are incorporated herein by reference). In one embodiment, the metal substrate 10 may also be used as (or to form) a second capacitor electrode. Utilizing the metal substrate as a second capacitor electrode is particularly useful in applications that operate in relatively high energy fields, such as EAS and RFID tags, HF, VHF and UHF devices, etc.

Furthermore, the present method may further comprise cleaning the substrate before forming any films or layers thereon. Cleaning the substrate may comprise conventional wet and/or dry cleaning (e.g., with a high-volatility organic solvent to remove any organic material or oil from the surface, with dilute and/or buffered aqueous acid to strip any surface oxide, etc.). As a result of cleaning, higher precision capacitors can be produced.

Next, an insulating layer 20 is deposited on metal substrate 10 using atomic layer deposition (ALD), as shown in FIG. 1A. This deposition process eliminates the need for a high cost planarization process, such as polishing the substrate surface, prior to use. In addition, atomic layer deposition allows for use of rolled metal foils, such as those typically used in batch processes and/or that involve large area substrates.

Atomic layer deposition is a well-known technique for thin film deposition. In typical ALD processes, monolayers of one or more chemical precursors to the thin film are deposited on the substrate surface. The monolayers react (typically with each other) spontaneously, or with heating. In the present method, the atomic layer deposition process may comprise depositing a monolayer of a first capacitor dielectric precursor, and optionally, heating the first capacitor dielectric precursor in an atmosphere conducive to forming the capacitor dielectric. In an alternative embodiment, different capacitor dielectric precursors (e.g., first and second capacitor dielectric precursors) are alternatingly deposited onto the substrate surface in cycles (e.g., from 1 to 1000 cycles, or any range of integer values therein), then reacted with each other (with optional heating in an inert or oxidizing/nitriding atmosphere), to form the capacitor dielectric.

For example, suitable capacitor dielectrics include, but are not limited to, $SiO_2$, $Si_3N_4$, silicon oxynitrides, silicon oxycarbide (SiOC), hydrogenated silicon oxycarbide (SiOCH), $Al_2O_3$, aluminosilicates, and $HfO_2$. Single molecule sources of capacitor dielectric precursors include alkyl, aryl and/or aralkyl siloxanes (e.g., tetraethyl orthosilicate) and/or aluminoxanes (e.g., triisopropoxyaluminum), and hafnium tetraalkoxides (e.g., tetraethoxyhafnium). Multiple sources for capacitor dielectrics to be alternately deposited include alkyl, aryl and/or aralkyl siloxanes and/or aluminoxanes (e.g., tetraethyl orthosilicate and triisopropoxyaluminum, tetramethoxysilane and tris[dimethylamino]aluminum, etc.). Preferably, the chemisorbed and/or physisorbed monolayers are heated in an oxidizing and/or nitriding atmosphere (e.g., containing dioxygen, ozone, carbon dioxide, water, NO, $N_2O$, $NO_2$, a combination thereof, etc.). The temperature for such heating may be from 150 to 600° C., or any range of values therein.

Where the metal substrate roughness may be relative high, achieving a high level of conformality (e.g., surface coverage of the insulating layer on the substrate) may be difficult using a conventional insulation layer deposition, such as chemical vapor deposition (CVD). Typically, the roughness of a metal substrate such as a metal foil can range from 1 Å rms to more than 1000 Å rms, as measured by atomic force microscopy (AFM). Depositing the insulating layers using atomic layer deposition (ALD) eliminates thin spots or undeposited areas, which may avoid premature breakdown and reduce high defect densities of the devices, regardless of the surface roughness of the metal foil.

Atomic layer deposition also enables deposition of insulating layers 20 having a wide range of thicknesses. The thickness of insulating layer 20 (deposited by ALD) can be as low as 3 Å or of theoretically infinite thickness. Preferably, the thickness is from 20 Å to 200 Å, more preferably 40 Å to 100 Å. Furthermore, the present invention enables the deposition of insulating layers having various composition(s). Insulating layer properties may be tailored using layer compositions, layered structures of varying compositions (thin film laminates), and layers formed under different process parameter optimization (temperature, exposure and/or pumpdown times, post-deposition anneals, etc.).

In addition, embodiments of the present invention allow for highly uniform deposition of the insulating layer on large area substrates in a batch process. This process can be surface limited and digital in nature, allowing deposition of highly precise thicknesses and compositions of a wide variety of insulating or metal films directly on metal substrates with excellent step coverage over all features. Conformal step coverage over local and long range roughness features, rolling marks in metal foil, scratches, particles, and other asperities which could otherwise cause discontinuities and unacceptably high defect densities in the insulating layer may be mitigated by use of the present invention.

Figure 1B:
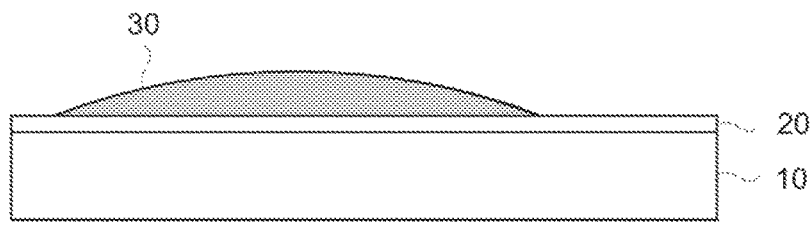

The exemplary method then deposits a first conductive or semiconductive layer on the first insulating layer 20 to form a first capacitor electrode 30, as shown in FIG. 1B. The conductive layer may comprise a metal, a metal alloy, a conductive metal compound or a doped semiconductor. For example, the metal may comprise Al, Zr, Hf, V, Nb, Ta, Cr, Mo, W, Mn, Re, Fe, Ru, Os, Co, Rh, Ir, Ni, Pd, Pt, Cu, Ag, Au, Zn, or Cd. The metal alloy may comprise a mixture of such metals, alone or in combination with one or more additional metals (e.g., In, Ga, Tl, Sn, Pb, Hg, Y, Sr, Ba, etc.). The conductive metal compound may comprise a silicide of a silicide-forming metal (e.g., Ti, Ta, Cr, Mo, W, Ni, Co, Pd, or Pt) and/or a nitride of a conducting metal nitride (e.g., Ti, Ta, Cr, Mo, W, Pd, or Pt). The doped semiconductor may comprise an organic semiconductor, a Group II-VI semiconductor (e.g., CdSe, ZnS, etc.), a Group III-V semiconductor (e.g., GaAs), or a Group IV semiconductor (e.g., silicon and/or germanium), doped with one or more Group III (e.g., B) or Group V (e.g., P, As, Sb) dopants.

Embodiments of the present method include printing a metal precursor ink on the insulating layer 20 to form the first conductive layer 30, although it may be deposited and patterned by other techniques as well. Printing the metal precursor ink may comprise inkjet printing, microspotting, stenciling, stamping, pen-coating, laser writing, syringe dispensing, pump dispensing, screen printing, gravure printing, offset printing, flexography printing, laser forward transfer, or local laser CVD. Thus, the present method may comprise forming the first capacitor electrode by printing a metal precursor in a pattern corresponding to the first capacitor electrode.

The first capacitor electrode 30 may have a dome-shaped profile. In many applications, a dome-shaped profile may be an ideal profile for use in printed electronic devices (see, e.g., U.S. patent application Ser. Nos. 11/842,884, 12/114,741 and 12/243,880, respectively filed Aug. 21, 2007, May 2, 2008 and Oct. 1, 2008, the relevant portions of which are incorporated herein by reference). Parameters such as ink viscosity, ink contact angle, solvent evaporation rate, and substrate surface energy can be adjusted to achieve a printed line or pattern that retains the shape in which it was printed and that has a dome-like and/or smooth, rounded cross-sectional profile after printing, drying, and/or curing. Furthermore, the dome-shaped profile obtained by printing (e.g., as shown in FIG. 1B) may be mathematically defined by the value of the tangent at points along the upper surface of the cross-section as a function of the horizontal dimension (see, e.g., U.S. patent application Ser. Nos. 12/114,741 and 12/243,880, cited above). In many cases, the profile varies smoothly in both the horizontal and vertical dimensions, such that sharp transitions in the topology can be avoided (see, e.g., U.S. patent application Ser. Nos. 11/842,884, 12/114,741 and 12/243,880, cited above). Ink viscosity may substantially affect the dome-shaped profile of the structure or film formed from the printed ink. A solute that increases the viscosity of the ink as the ink dries may increase the probability and/or reproducibility of obtaining the dome-shaped profile.

The metal and/or semiconductor precursor inks may be printed in or under an inert and/or reducing atmosphere. Thus, printing may further include purging the atmosphere in which the substrate is placed, then introducing an inert and/or reducing gas into the atmosphere, prior to printing. In various embodiments, the inert gas may comprise He, Ar, $N_2$, etc., and may further comprise a reducing gas, such as $H_2$, $NH_3$, $SiH_4$, and/or other source of gas-phase reducing agent (e.g., in an amount up to about 20 vol. %). The inert and/or reducing gas atmosphere may reduce any incidence of inadvertent and/or undesired oxide formation. In a preferred embodiment, the inert atmosphere has an $O_2$ level of <<1 ppm (to avoid unacceptably high oxygen content in the formed films, which may result in poor device performance). In one embodiment, the inert atmosphere consists essentially of Ar, and may further include less than 0.1 ppm $O_2$ and less than 100 ppm $N_2$.

Alternatively, embodiments of the present method include printing a semiconductor precursor ink (see, e.g., U.S. Pat. No. 7,422,708 and U.S. patent application Ser. Nos. 10/616,147, 10/789,274, 10/789,317, 11/084,448, 11/203,563, 11/867,587, 12/109,338, and 12/114,741, filed on Jul. 8, 2003, Feb. 27, 2004, Feb. 27, 2004, Sep. 24, 2004, Mar. 18, 2005, Aug. 11, 2005, Oct. 4, 2007, Apr. 24, 2008, and May 2, 2008, respectively, the relevant portions of which are incorporated herein by reference. The ink may comprise one or more semiconductor precursors, such as (poly)silanes, (poly)germanes, (poly)silagermanes, silicon and/or germanium nanoparticles, etc., in a non-polar solvent. In many semiconductor precursor inks, viscosity may be adjusted (e.g., increased) by adjusting (e.g., increasing) the amount or proportion of higher molecular weight (MW) solutes in the ink, for instance a polysilane or other Group IVA compound (e.g., a compound comprising Si and/or Ge) having at least 15 Si and/or Ge atoms therein. The semiconductor precursor ink may be printed by any of the same techniques as a metal precursor ink. In the printing embodiments, the dimensions of all or substantially all of the patterned features in the device may be defined directly by parameters and/or conditions of the present printing process.

Optionally, the ink composition may be irradiated during or after the printing of the ink composition (see, e.g., U.S. Pat. Nos. 7,152,804, 7,294,449, 7,314,513 and 7,422,708 and U.S. patent application Ser. Nos. 10/749,876, 10/789,274, 10/789,317, 11/203,563, 11/452,108, 11/818,078, 11/888,942, 11/888,949, 11/842,884, 12/114,741 and 12/243,880, respectively filed Dec. 31, 2003, Feb. 27, 2004, Feb. 27, 2004, Aug. 11, 2005, Jun. 12, 2006, Jun. 12, 2007, Aug. 3, 2007, Aug. 3, 2007, Aug. 21, 2007, May 2, 2008 and Oct. 1, 2008). The ink may be irradiated with light having a wavelength (or wavelength band) in the range of 200 nm to 450 nm, such as 220 nm to 400 nm, or 250 to 380 nm (or any other range of values therein) in the case of (poly)silane materials, or in the range of 250 nm to 1000 nm, such as 450 nm to 900 nm, or 480 to 780 nm (or any other range of values therein) in the case of metal precursor materials. Suitable sources for non-UV radiation include white light sources, Xe lamps, visible LEDs, UV LEDs coated with down-converting phosphors, IR lamps and lasers, visible lasers, etc., including sources of UV radiation having one or more UV filters positioned between the lamp output and the sample to be irradiated. A suitable source of UV radiation may comprise essentially any UV radiation source, such as a mercury vapor and/or mercury arc lamp, a UV LED, a UV laser, etc., or a white light source or other non-UV source having one or more visible and/or IR filters positioned between the lamp output and the sample to be irradiated, etc. The irradiating step is also preferably conducted under an inert and/or reducing gas, as for the printing/depositing step, to reduce any incidence of inadvertent and/or undesired oxide formation.

Typically, the first (semi)conductive layer is dried, then cured and/or annealed (e.g., in an inert and/or reducing atmosphere) to form conductive electrode 30, as shown in FIG. 1B. The curing step converts the dried patterned precursor to a conductive layer (see, e.g., the above-cited U.S. Patent Nos. and Patent Application Nos., the relevant portions of which are incorporated herein by reference). The annealing step generally densifies and/or improves one or more electronic and/or physical properties of the cured conductive film. For example, the annealing process may activate dopants within the (semi)conductive layer and/or reduce the resistance between the electrically functional substrate and subsequently formed conductor (see, e.g., U.S. Pat. No. 7,314,513 and U.S. patent application Ser. No. 11/203,563, filed Aug. 11, 2005, the relevant portions of which are incorporated herein by reference).

In many, if not most, embodiments, the drying temperature may be from 30° C. to 300° C., 50° C. to 200° C., or any value or range of values therein (e.g., 50° C. to 150° C.). The length of time may be sufficient to remove substantially all of the solvent and/or substantially all of the additive(s) from the coated or printed metal precursor ink (e.g., from 1 second to 4 hours, 1 minute to 120 minutes, or any other range of values therein). In other embodiments, drying comprises removing the solvent(s) in a vacuum, with or without applied heat. The vacuum may be from 1 mtorr to 300 torr, 100 mtorr to 100 torr, 1-20 torr, or any other range of values therein, and may be applied by vacuum pump, aspirator, venturi tube, etc.

After printing and drying a metal precursor ink, the metal-containing precursor film may be reduced by various methods. For example, the metal-containing precursor film may be exposed to a reducing agent and heated at a temperature ranging from greater than ambient temperature to about 200-400° C., and subsequently, the conductive layer may be cured and/or annealed at a temperature sufficiently high and/or for a time sufficiently long to form a more conductive elemental metal (see, e.g., U.S. patent application Ser. No. 12/131,002, filed May 30, 2008, the relevant portions of which are incorporated herein by reference). The annealing temperature for forming the metal electrode 30 from the reduced metal-containing precursor film may range from 120 to 800° C., or any temperature or range of temperatures therein.

In the case of (poly)silanes, (poly)germanes, (poly)silagermanes, and/or (passivated) silicon and/or germanium nanoparticles, curing generally comprises heating the dried composition to a temperature of at least about 300° C. (preferably at least about 350° C., and more preferably at least about 400° C.) for a length of time sufficient to convert the composition to an amorphous, hydrogenated film comprising silicon and/or germanium. Such heating may be conducted for a length of time of at least 1 minute, 3 minutes or 5 minutes (see, e.g., the above-cited U.S. Patent Nos. and U.S. Patent Application Nos. relating to (poly)silanes, (poly)germanes, (poly)silagermanes, and/or silicon and/or germanium nanoparticles).

In a further embodiment relating to a semiconductive layer 30, the method further comprises an annealing step, which may comprise heating the substrate and the printed, "soft-cured" and/or "hard-cured" feature to a temperature and for a length of time sufficient to provide the film with certain predetermined or desired characteristics or qualities (see, e.g., U.S. patent application Ser. No. 12/114,741, filed May 2, 2008, the relevant portions of which are incorporated herein by reference). Annealing at a higher temperature and/or for a greater length of time may (re)crystallize part or all of a semiconductor film and/or activate at least some of the dopant (if present). Alternatively, annealing to form a microcrystalline or polycrystalline silicon and/or germanium film and/or to activate dopant may comprise conventional laser crystallization and/or UV flash lamp annealing.

Naturally, embodiments of the invention relate to methods and devices containing a bilayer or other multi-layer capacitor electrode 30 (e.g., containing a lower semiconductive layer and a metal or metal alloy layer thereon, which can be annealed in an inert, reducing and/or nitrogen-containing atmosphere to form a metal silicide (e.g., at the interface between the lower semiconductive layer and the overlying metal/metal alloy layer) and/or a metal nitride (e.g., at the uppermost surface of the metal/metal alloy layer). If a metal silicide is formed, any unreacted and non-nitrided metal can be removed by selectively etching the unreacted and non-nitrided metal.

Figure 1C:
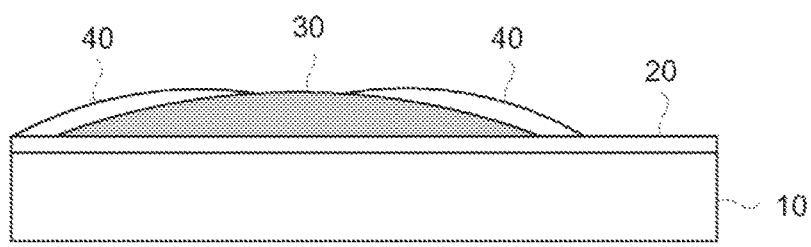
Figure 1D:
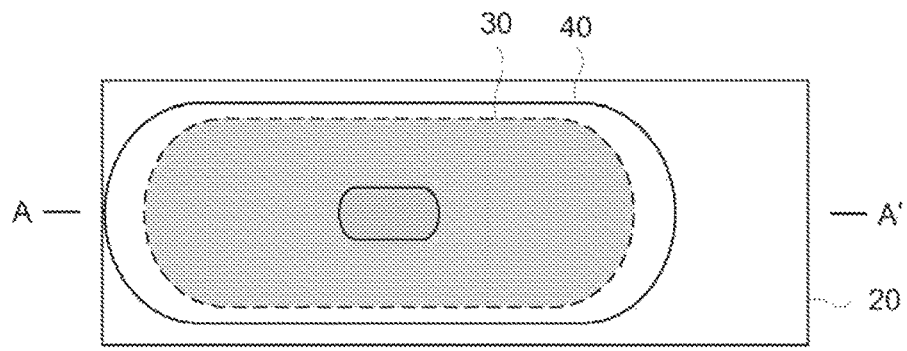
FIG. 1D shows a top-down view of the exemplary structure of FIG. 1C.

The exemplary method further comprises depositing a second insulating layer 40 on the first capacitor layer 30, as shown in FIG. 1C. The second insulating layer 40 may comprise one or more organic and/or inorganic dielectrics. The organic dielectric may comprise, for example, a polyimide, a polyacrylate, a polyether sulfone, a polyethylene naphthalate [PEN], or a polyether ether ketone [PEEK]. Examples of inorganic dielectrics include individual films or stacked combinations of $SiO_2$, $Si_3N_4$, silicon oxynitrides, $Al_2O_3$, $SiO_2.Al_2O_3$, $TiO_2$, $HfO_2$, etc. The second insulating layer 40 may have a minimum thickness to reduce capacitive coupling of the (top) metal electrode 30 to any overlying layer (e.g., an antenna and/or inductor, or other conductive feature electrically connecting the first electrode 30 to the other electrode, such as the substrate or a portion thereof) and/or to control the resistance of the (top) metal electrode. Depending on the insulator and any particular capacitance targets, the minimum thickness of the insulating layer may be about 0.1 µm, 1 µm or any other value of at least 0.1 µm.

FIG. 1C shows the second insulating layer 40 patterned on the first capacitor electrode 30 and the first insulating layer 20. The second insulating layer 40 may be deposited by printing (as described herein; see also U.S. patent application Ser. No. 12/109,338, filed on Apr. 24, 2008, the relevant portions of which are incorporated herein by reference), or by blanket deposition (e.g., chemical vapor deposition [CVD]) and patterning. Printing the second insulating layer 40 generally comprises printing one or more dielectric/insulator precursors in one or more solvents suitable for printing and in which the precursor(s) is/are soluble, in a pattern onto the first capacitor electrode 30 and the first insulating layer 20.

Generally, after printing, includes drying the dielectric printed ink composition at a temperature for a length of time sufficient to remove substantially all of the remaining solvent(s) from the ink composition. In other embodiments, drying comprises removing the solvent(s) in a vacuum, with or without applied heat. Evaporating the solvent may comprise heating the coated or printed precursor composition (and/or substrate) to a temperature of from about 30° C. to about 200° C. (e.g., from 30° C. to about 90° C., from 80° C. to about 120° C., or any other range of values therein). The vacuum may be from 1 mtorr to 300 torr, 100 mtorr to 100 torr, 1-20 torr, or any other range of values therein, and may be applied by vacuum pump, aspirator, venturi tube, etc. The solvent can be evaporated under an inert atmosphere, as described above.

Printing the dielectric/insulator ink composition may further include a curing step to convert the dried, patterned dielectric/insulator precursor to a dielectric and/or insulator material. Printing may further comprise an annealing step, which may comprise heating the substrate and the printed, cured dielectric/insulator film to a sufficient temperature and for a sufficient length of time to provide the film with certain predetermined or desired characteristics or qualities (see, e.g., U.S. patent application Ser. Nos. 12/109,338 and 12/243,880, respectively filed Apr. 24, 2008 and Oct. 1, 2008, the relevant portions of which are incorporated herein by reference).

Figure 1E:
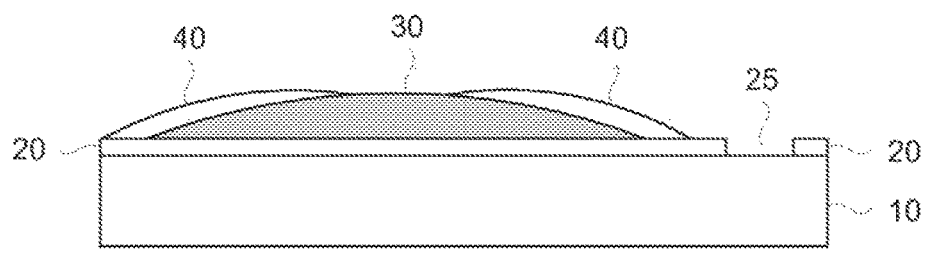
FIG. 1E shows a cross-sectional view of an exemplary embodiment of the present capacitor, ready for attachment to an antenna or other electronic circuit element.

The exemplary method then removes a portion of the first insulating layer 20 over the substrate, forming an opening 25 in the first insulating layer 20 and exposing the metal substrate 10, as shown in FIG. 1E. The portion of the first insulating layer 20 may be removed by wet or dry etching, optionally using a mask (not shown).

Figure 1F:
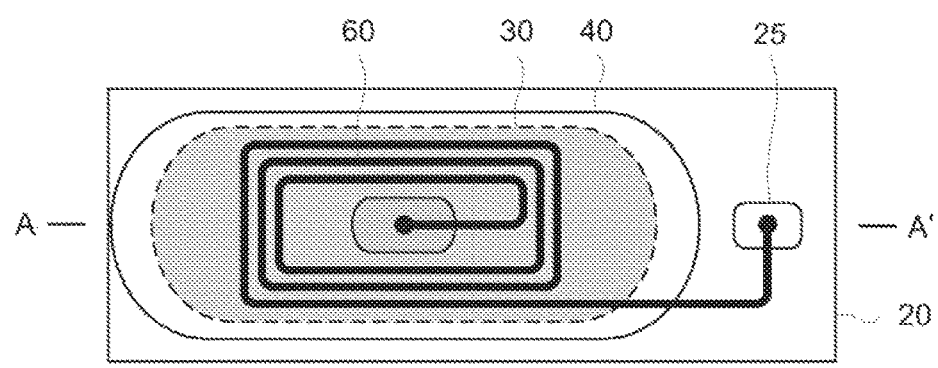
FIG. 1F shows a top-down view of components of the exemplary embodiment of FIG. 1E.
Figure 1G:
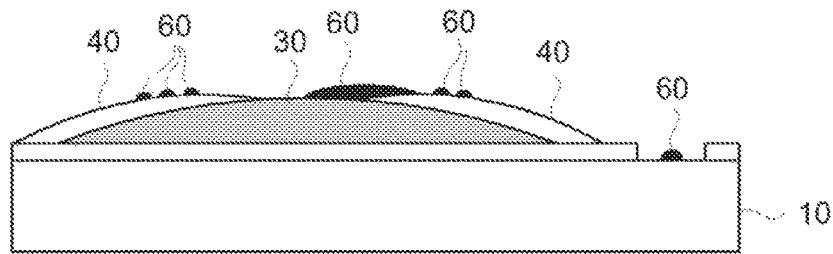
FIG. 1G shows a cross-sectional view of an exemplary EAS tag.

FIG. 1F depicts a top-down or layout view of an antenna 60 electrically connected to the conductive metal substrate 10 and the first capacitor electrode 30. A cross-section of the device of FIG. 1F along the A-A' axis is shown in FIG. 1G. In this embodiment, the layer 30 forms the upper capacitor electrode, and the conductive metal substrate 10 forms a lower capacitor electrode. As a result, the metal substrate 10 is capacitively coupled to the first capacitor electrode. Definition and completion of an electronic device (e.g., an EAS tag) including the capacitor structure may be achieved by various techniques, depending on the application and/or the requirements therefor (see, e.g., U.S. Pat. Nos. 7,152,804, 7,286,053 and 7,387,260, and U.S. patent application Ser. Nos. 11/243,460 and 11/452,108, respectively filed Oct. 3, 2005 and Jun. 12, 2006, the relevant portions of each of which are incorporated herein by reference).

The antenna 60 may be formed by printing a conductive ink in a spiral or concentric ring pattern on the first and second dielectric layers 20 and 40, such that opposite ends of the pattern are in contact with exposed areas of the first conductive layer 30 and the substrate 10. The conductive ink, printing technique and drying/reducing/curing/annealing steps may be selected from those described above. In addition, a bulk conductor (e.g., selected from the above-described metals) may be plated onto the printed conductive antenna pattern, generally by electroplating or electroless plating (for plating a bulk conductor onto a printed conductive pattern, see U.S. patent application Ser. No. 12/131,002, filed May 30, 2008, the relevant portions of which are incorporated herein by reference). Alternatively, the conductive material for the antenna can be blanket deposited (e.g., by sputtering or evaporation) and conventionally patterned to form the antenna 60.

Figure 2A:
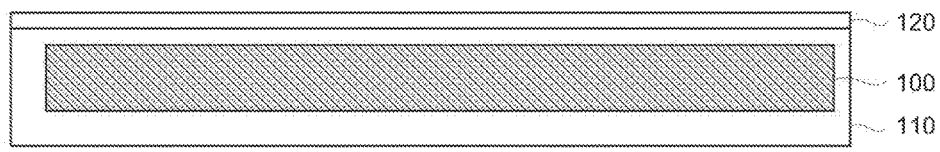
FIGS. 2A-2C show cross-sectional views of further exemplary embodiments, in which the metal substrate further comprises a barrier layer.

In an alternative embodiment, the metal substrate 100 further comprises a barrier layer 110, as shown in FIG. 2A. The barrier layer 110 may comprise an organic and/or inorganic dielectric as described above, or a metal compound selected from the group consisting of nitrides and alloys of titanium, tantalum, tungsten, molybdenum, palladium and platinum. The barrier layer 110 (laminate or single layer) between the substrate 100 (as received or as modified prior to atomic layer disposition) and an overlying insulator 120 (see FIG. 2B) mitigates adverse dielectric-metal interactions and adverse surface effects from variations in the roughness of the substrate 100. Furthermore, the barrier layer 110 may be deposited by blanket deposition (as described herein) and/or by plating or other deposition technique from a bath, on at least one major surface or both major surfaces of the metal substrate 100.

Subsequent to the formation of the barrier layer 110, as shown in FIG. 2A, a first capacitor dielectric layer 120 is deposited directly on one major (e.g., an upper) surface of the barrier layer 110 using atomic layer deposition (ALD), as described above with regard to FIG. 1A. The first capacitor dielectric layer 120 may comprise a material and have a thickness as described above with regard to capacitor dielectric 20 in FIG. 1A. Thus, as previously discussed, depositing the insulating layer 120 using atomic layer deposition (ALD) eliminates thin spots or undeposited areas, which may avoid premature breakdown and high defect density of the semiconductor device. Also, the properties of first capacitor dielectric layer 120 may be tailored using layer compositions, layered structures of varying compositions (thin film laminates), and layers formed under different process parameter values and/or conditions (e.g., temperature, exposure and/or pumpdown times, post-deposition annealing, etc.). Suitable insulating layer compositions include, but are not limited to, $SiO_2$, $Si_3N_4$, silicon oxynitrides, SiOC, SiOCH, $Al_2O_3$, and $HfO_2$.

Figure 2B:
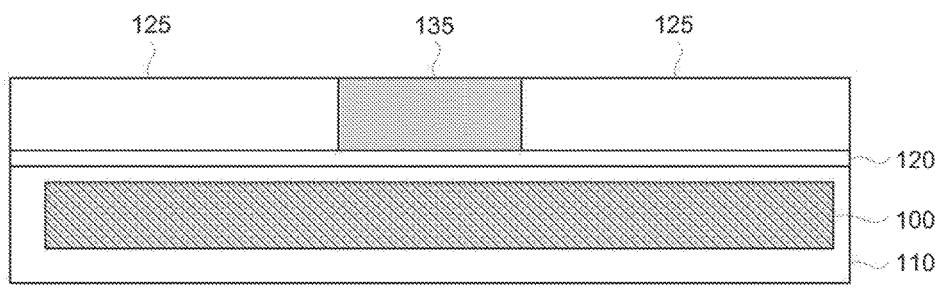

Next, as shown in FIG. 2B, a first insulator layer 125 may be formed on the insulating layer 120, using one or more of the steps discussed above. As shown in FIG. 2B, the insulator layer 125 may be formed by blanket deposition and patterning. However, the first insulator layer 125 may also be printed by any of the printing techniques described herein. The pattern may correspond to a relatively small opening in the insulator layer 125, which may have a substantially round, square, or rounded square shape. The first insulator layer 125, which may form a second capacitor dielectric layer, may comprise one or more of the dielectric and/or insulator materials described above with regard to layer 40 in FIG. 1C.

Thereafter, as shown in FIG. 2B, a first upper capacitor electrode 135 is formed in the opening in the first insulator layer 125. In this embodiment, the first upper capacitor electrode 135 may be deposited by blanket deposition and planarization (e.g., chemical mechanical polishing), or by printing of a conductive ink (as described herein) into and/or around the area of the opening in the first insulator layer 125, followed by drying, reduction/curing, and optionally annealing. While the first upper capacitor electrode 135 shown in FIG. 2B is planarized to be coplanar with the first insulator layer 125, such planarization is not necessary. The metal, conductive ink, and printing technique can be any described herein.

Alternatively, the first upper capacitor electrode 135 may be formed (e.g., by blanket deposition and conventional patterning) before the first insulator layer 125 is formed. In either case, the thickness of the first capacitor dielectric layer 120 and the barrier layer 110 (when it comprises an organic and/or inorganic dielectric) largely determines the breakdown voltage of the capacitor.

Figure 2C:
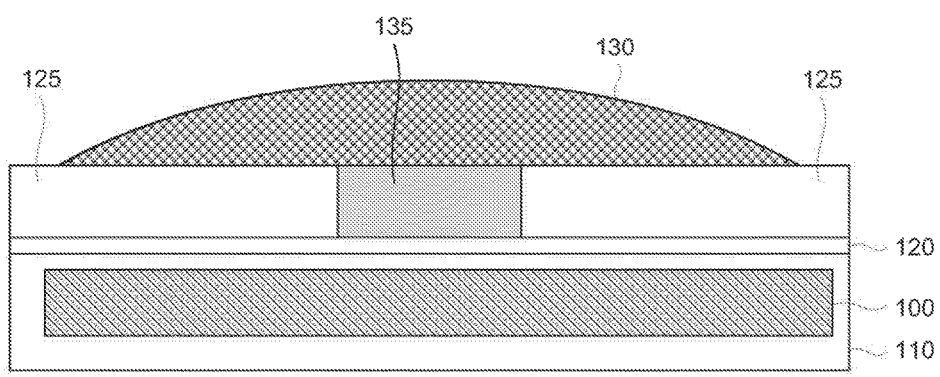

In FIG. 2C, a second upper capacitor electrode 130 may be formed (e.g., by printing). The second upper capacitor electrode 130 may comprise any material and be printed by any technique using any ink as described for the capacitor electrode 30 of FIG. 1B. Also, as for the capacitor electrode 30 of FIG. 1B, the second upper capacitor electrode 130 may have a dome-shaped profile. For reasons discussed above, a dome-shaped profile may be an ideal profile for use in a printed device layer. In this embodiment, the second upper capacitor electrode 130 may form a bulk capacitor, having a significantly greater area (e.g., by at least 1-2 orders of magnitude) than first upper capacitor electrode 135, and having most of the charge storage capability of the "dual-thickness dielectric" capacitor shown in FIG. 2C.

Also, the second upper capacitor electrode 130 may be electrically coupled to the metal substrate 100 (and/or barrier layer 110, when barrier layer 110 comprises a conductive material) in substantially the same manner as in FIGS. 1C-1G. However, the cross-section of FIG. 2C may represent a cross-section along an axis orthogonal to the A-A' axis in FIGS. 1D and 1F, so that an exposed area of first capacitor dielectric layer 120 over metal substrate 100 and barrier layer 110 (for forming an opening similar to opening 25 in FIGS. 1E-1F) is either above or below the plane of the page in FIG. 2C.

Exemplary Capacitors and Methods of Making the Same using Insulative Substrates

Embodiments of the present invention also concern a method of forming a capacitor comprising an insulative substrate. The insulative substrate may be selected from the group consisting of polyimides, glass slips or sheets, glass/polymer laminates, high temperature polymers, and combinations thereof, in addition to any others described herein nor in any U.S. patent or Patent Application incorporated herein by reference. In addition, the insulative substrates may comprise a bulk insulating substrate and at least one insulating buffer layer thereon. The insulating buffer layer may comprise an organic dielectric, which is selected from the group consisting of polyimide, a polyether sulfone, a polyethylene naphthalate [PEN], or a polyether ether ketone [PEEK], or an inorganic dielectric, as described herein.

Figure 3A:
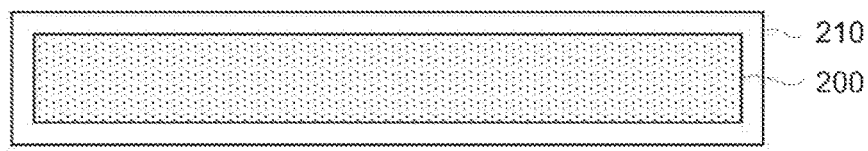
FIGS. 3A-3F show cross-sectional views of various stages of exemplary embodiments of the present method, in which the substrate comprises an insulative support and a barrier layer thereon.

Thus, a further aspect of the present invention concerns a method of forming a capacitor on an insulative substrate 200 and optional barrier layer and/or planarization layer 210, as shown in FIG. 3A. FIG. 3A depicts the barrier layer or planarization layer 210 formed on an entire circumference of the insulative substrate 200, although the barrier/planarization layer 210 may formed on a single major surface of the insulative substrate 200. The barrier layer generally reduces, inhibits or prevents out-diffusion of dopants from a substrate comprising doped glass, or another component from a different substrate 200 that may have adverse effects on subsequently deposited layer(s). The planarization layer generally provides a surface having relatively predictable roughness properties, regardless of the variations in surface roughness of the substrate 200. Thus, a planarization layer may, in effect, serve as a "barrier" to adverse substrate surface roughness variations.

Figure 3B:
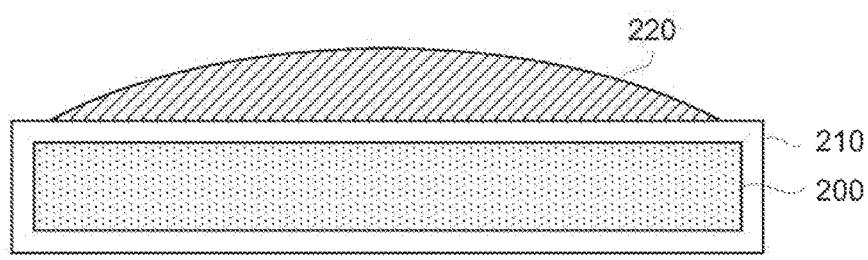

Next, a first conductive layer 220 may be deposited on the barrier layer 210, as shown in FIG. 3B, to form a first/lower capacitor electrode 220. Alternatively, the first conductive layer 220 may be deposited directly on a major surface of the insulative substrate 200. The first conductive layer 220 may be selected from the group consisting of Zr, Hf, V, Nb, Ta, Cr, Mo, W, Mn, Re, Fe, Ru, Os, Co, Rh, Ir, Ni, Pd, Pt, Cu, Ag, Au, Zn, Cd, and combinations thereof (with another metal in the group or outside the group, as described herein), although conductive compounds and multi-layer electrodes are also contemplated. The first capacitor electrode may be printed and may have a dome-shaped cross-sectional profile, as shown in FIG. 3B. Thus, embodiments of the present method further relate to forming the first capacitor electrode 220 by printing an ink containing metal precursor in a pattern corresponding to the first capacitor electrode, then annealing the metal precursor.

Figure 3C:
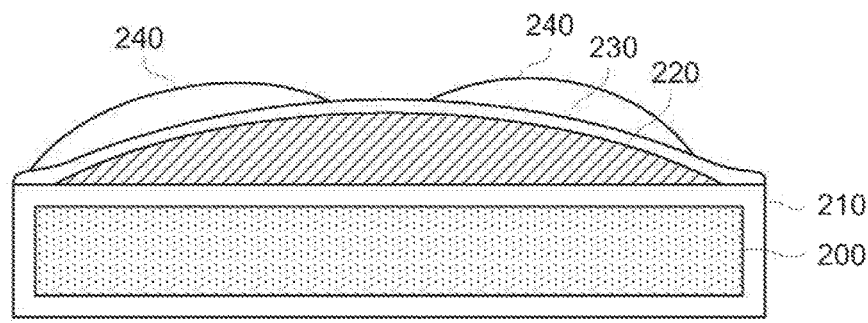

Next, an insulating layer 230 is deposited on the first capacitor electrode 220 and the insulative substrate 200 or the barrier/planarization layer 210 using atomic layer deposition, as shown in FIG. 3C and described elsewhere herein. Similar to other embodiments discussed above, the insulating layer 230 formed by atomic layer deposition provides a first capacitor dielectric that is useful for providing a relatively low dielectric breakdown for the capacitor.

As is further shown in FIG. 3C, the present method may further include depositing a second insulating layer 240 on the first insulating layer 230, and on and/or adjacent to the barrier/planarization layer 110 and/or insulative substrate 100. The second insulative layer 240 comprises a dielectric material the same as or similar to that of insulative/dielectric layers 40 (FIGS. 1C-1D) and 125 (FIG. 2B), and generally has a thickness greater than the first insulative layer 230. For example, the second insulating layer 240 may have a thickness of 50 Å to 10,000 Å, 100 Å to 8,000 Å, 500 Å to 5,000 Å, or other range of values that is greater than the thickness of the first insulative layer 230.

Figure 3D:
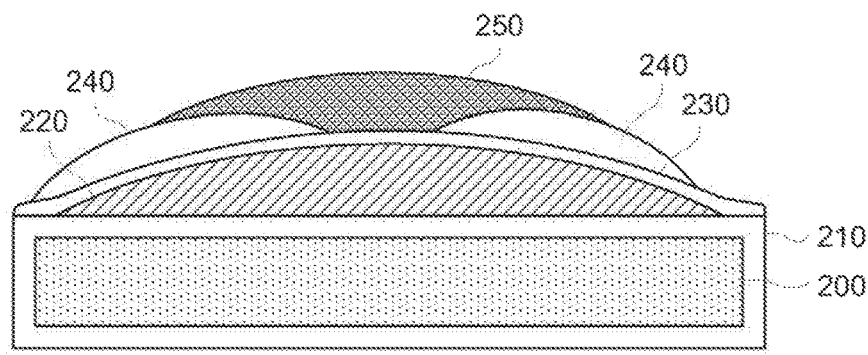

Thereafter, a second conductive layer is formed on the first insulating layer 230 and the second insulative layer 240, to form a second capacitor electrode 250, as shown in FIG. 3D. The second capacitor electrode 250 comprises a second conductive layer, in which the conductor(s) are selected from those described herein, and which may be formed by deposition, patterning and/or post-deposition/patterning techniques as described herein (see, e.g., the descriptions of conductive electrodes/layers 30 [FIG. 1B], 130 [FIG. 2C], and 220 [FIG. 3B]). As a result, the second insulative layer 240 provides a bulk dielectric, similar to layer 125 in FIG. 2B.

Figure 3E:
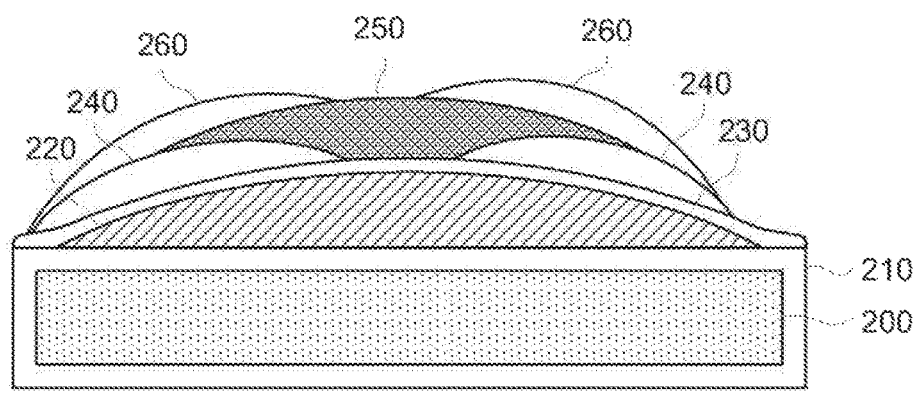

A third insulating layer 260 is formed on the second capacitor electrode 250 and the first insulating layer 240, as shown in FIG. 3E. The third insulating layer 260 may have a thickness, comprise a material, and be formed by a process similar to second insulating layer 240. The third insulating layer 260 generally insulates the second (upper) capacitor electrode 250 from the electromagnetic effects of any overlying conductive structures or features.

Figure 3F:
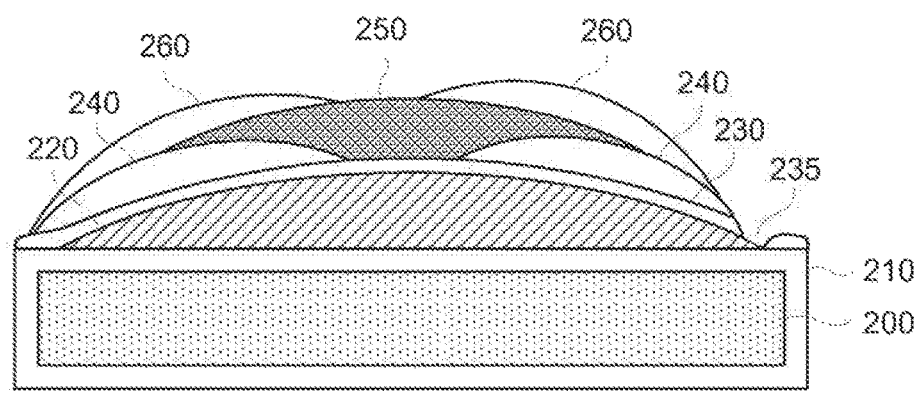
Figure 3G:
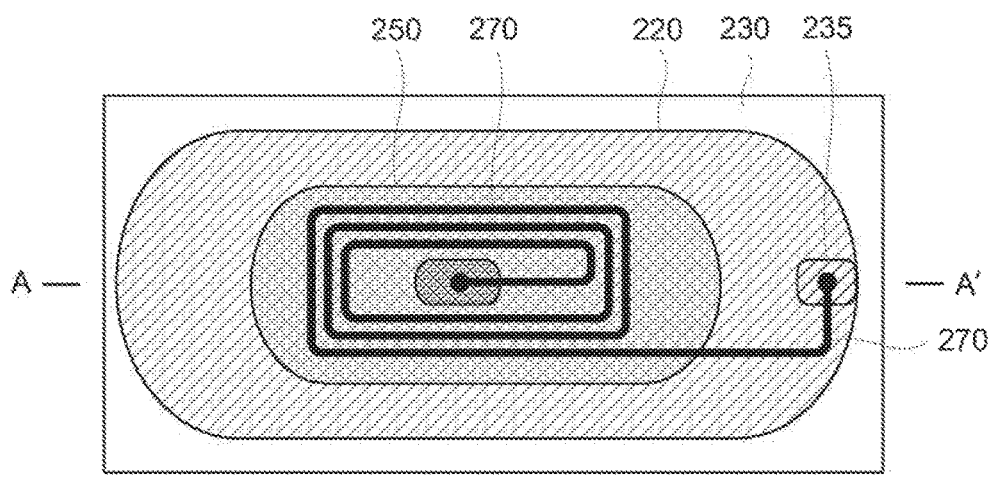
FIG. 3G shows a top-down view of components of the exemplary embodiment of FIG. 3F.
Figure 3H:
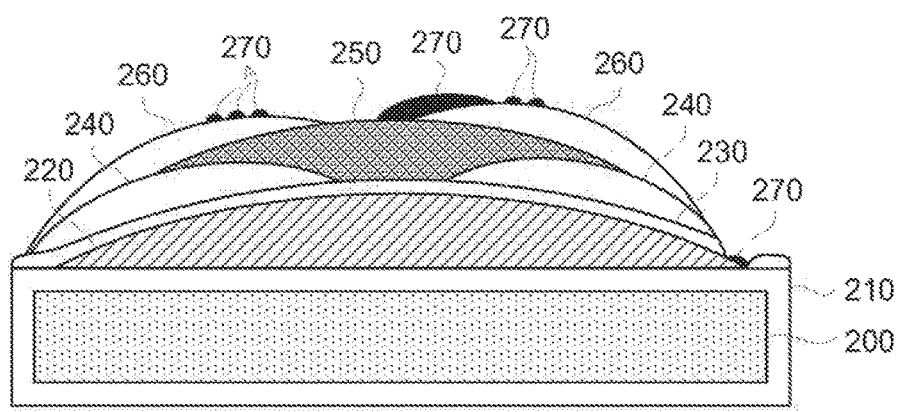
FIG. 3H shows a cross-sectional view of an exemplary EAS device made using the exemplary method of FIGS. 3A-3F.

Then, as shown in FIG. 3F, a portion of the first insulating layer 230 is removed, to form an opening 235 exposing a portion of the first capacitor electrode 220. FIG. 3H is a cross-section of the device of FIG. 3G along axis A-A'. Removing the portion of the first insulating layer 135 may comprise wet or dry etching, and may be performed using a mask to protect areas other than that being etched from being etched. In embodiments such as that disclosed in FIG. 3F, an antenna and/or inductor 270 may be electrically connected to each of the upper conductive layer 250 and the first conductive layer 220, as shown in FIGS. 3G-3H. The antenna may comprise the same materials and be formed in the same way as the antenna 60 in FIGS. 1F-1G.

CONCLUSION/SUMMARY

Embodiments of the present invention enable precise deposition of an insulating layer on a substrate that may have variations in surface roughness and/or composition. The present invention advantageously utilizes atomic layer deposition (ALD) for depositing a capacitor insulating layer on a substrate, without a need for additional planarization through high cost polishing of the substrate surface. Thus, the present invention may replace relatively difficult-to-control conventional processes and structures by providing a deposition process that produces a high level of conformality in the insulating layer on a wide range of substrates.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A capacitor, comprising:
   a. a metal substrate comprising a foil or sheet of stainless steel, molybdenum, copper or aluminum, said metal substrate further comprising a barrier layer thereon;
   b. a first insulating layer on said metal substrate, said first insulating layer having a substantially uniform thickness of from 3 Å to 200 Å and a predetermined breakdown voltage;
   c. a first capacitor electrode on said first insulating layer, wherein said first capacitor electrode (i) has an uppermost surface that is smooth and/or curved, and (ii) is capacitively coupled to said metal substrate;
   d. a second insulating layer on said first capacitor electrode and said first insulating layer; and
   e. an antenna on said second insulating layer, electrically connected to said first capacitor electrode and to said metal substrate.

2. The capacitor of claim 1, wherein said metal substrate comprises a foil having a thickness from about 1 μm to about 300 μm, and said second insulating layer has a thickness of from 20 Å to 400 Å.

3. The capacitor of claim 1, wherein said barrier layer comprises an organic and/or an inorganic dielectric material.

4. The capacitor of claim 3, wherein said organic dielectric material comprises a polyimide, a polyacrylate, a polyether sulfone, a polyethylene naphthalate, or a polyether ether ketone, and said inorganic dielectric material comprises $SiO_2$, $Si_3N_4$, a silicon oxynitride, $Al_2O_3$, an aluminosilicate, $TiO_2$, $HfO_2$, or a combination thereof.

5. The capacitor of claim 1, wherein each of said first and second insulating layers independently comprises $SiO_2$, $Si_3N_4$, a silicon oxynitride, $Al_2O_3$, SiOC, SiOCH, or $HfO_2$.

6. The capacitor of claim 1, wherein said first insulating layer is deposited by atomic layer deposition.

7. The capacitor of claim 6, wherein said first insulating layer has a thickness from about 20 Å to about 200 Å.

8. The capacitor of claim 7, wherein said first insulating layer has a thickness from about 40 Å to about 100 Å.

9. The capacitor of claim 1, wherein said first capacitor electrode comprises a first conductive or semiconductive layer.

10. The capacitor of claim 9, wherein said first conductive layer comprises a metal, a metal alloy, a conductive metal compound or a doped semiconductor.

11. The capacitor of claim 10, wherein said metal comprises Al, Zr, Hf, V, Nb, Ta, Cr, Mo, W, Mn, Re, Fe, Ru, Os, Co, Rh, Ir, Ni, Pd, Pt, Cu, Ag, Au, Zn, Cd, or a combination thereof.

12. The capacitor of claim 1, wherein said first capacitor electrode comprises a printed first conductive layer.

13. The capacitor of claim 1, wherein said first capacitor has a dome-shaped cross-sectional profile.

14. The capacitor of claim 1, wherein said second insulating layer comprises a printed insulating layer.

15. The capacitor of claim 1, wherein said metal substrate comprises a lower capacitor electrode and said first capacitor electrode comprises an upper capacitor electrode.

16. The capacitor of claim 1, wherein said first insulating layer includes an opening.

17. The capacitor of claim 1, wherein said opening is configured to expose said metal substrate, and said antenna has an end in contact with said exposed metal substrate.

18. The capacitor of claim 1, wherein said antenna comprises a printed antenna.

19. The capacitor of claim 18, wherein said printed antenna comprises a first end in contact with said first capacitor electrode and (ii) a second end in contact with said metal substrate.

20. The capacitor of claim 1, wherein the thickness of the first insulating layer varies by no more than ±5%.

* * * * *